United States Patent
Rashidzadeh et al.

(10) Patent No.: US 9,261,533 B2
(45) Date of Patent: Feb. 16, 2016

(54) APPARATUS FOR THE AUTOMATED TESTING AND VALIDATION OF ELECTRONIC COMPONENTS

(75) Inventors: Rashid Rashidzadeh, Windsor (CA); Majid Ahmadi, Windsor (CA); Nabeeh Kandalaft, Windsor (CA)

(73) Assignee: UNIVERSITY OF WINDSOR, Windsor (CA)

( * ) Notice: Subject to any disclaimer, the term of this patent is extended or adjusted under 35 U.S.C. 154(b) by 361 days.

(21) Appl. No.: 14/006,020

(22) PCT Filed: Mar. 7, 2012

(86) PCT No.: PCT/CA2012/000214
§ 371 (c)(1),
(2), (4) Date: Nov. 13, 2013

(87) PCT Pub. No.: WO2012/126087
PCT Pub. Date: Sep. 27, 2012

(65) Prior Publication Data
US 2014/0062516 A1    Mar. 6, 2014

Related U.S. Application Data

(60) Provisional application No. 61/457,404, filed on Mar. 21, 2011.

(51) Int. Cl.
*G01R 31/00* (2006.01)
*G01R 1/04* (2006.01)
(Continued)

(52) U.S. Cl.
CPC .......... *G01R 1/0408* (2013.01); *G01R 31/2889* (2013.01); *G01R 1/06716* (2013.01); *G01R 31/2822* (2013.01)

(58) Field of Classification Search
CPC .......... G01R 31/2834; G01R 31/2832; G01R 31/2889; G01R 31/2822; G01R 1/0408; G01R 1/06716
USPC .............. 324/750.16, 750.19, 756.01, 756.07, 324/762.01, 762.02
See application file for complete search history.

(56) References Cited

U.S. PATENT DOCUMENTS 3,142,112 A * 7/1964 Burkig ................. H05K 1/0289
                                                    174/253
4,774,462 A * 9/1988 Black ...................... G01R 1/04
                                                    324/754.03

(Continued)

FOREIGN PATENT DOCUMENTS

CN          1837830 A      9/2006
CN       101059550 A     10/2007
(Continued)

OTHER PUBLICATIONS

Smiths Connectors, Copyright 2015, "Test Solutions for Semiconductor," smithconnectors.com.*
(Continued)

*Primary Examiner* — Patrick Assouad
*Assistant Examiner* — Sean Curtis (57) ABSTRACT

An automatic test equipment (ATE) unit, which incorporates a mass interconnect system. The mass interconnect system is provided with a universal mounting table for use with receiver and test interface modules for electronically mounting and testing a variety of different types of electronic components or unit under test thereon. The mounting table test interface module incorporates MEMS based spring contacts to provide high-speed micro test-channels in order to establish signal connectivity between the components or unit under test and the tester, and which maintain the signal integrity up to 50 GHz without significant signal loss distortion.

20 Claims, 7 Drawing Sheets

(51) Int. Cl.
*G01R 1/067* (2006.01)
*G01R 31/28* (2006.01)

(56) References Cited

U.S. PATENT DOCUMENTS

| | | | | | |
|---|---|---|---|---|---|
| 4,799,006 | A * | 1/1989 | Strohschneider | .. | G01R 1/07314 324/754.15 |
| 5,450,017 | A * | 9/1995 | Swart | ................ | G01R 1/07378 324/754.08 |
| 5,798,654 | A * | 8/1998 | Van Loan | .......... | G01R 1/07328 324/750.19 |
| 5,945,837 | A * | 8/1999 | Fredrickson | ....... | G01R 1/07307 324/754.08 |
| 6,033,233 | A * | 3/2000 | Haseyama | ......... | G01R 1/06716 439/515 |
| 6,181,149 | B1 * | 1/2001 | Godfrey | ............... | G01R 1/0408 324/750.19 |
| 6,468,098 | B1 * | 10/2002 | Eldridge | .............. | G01R 1/0735 439/197 |
| 6,686,732 | B2 * | 2/2004 | Parrish | ............... | G01R 31/2889 324/756.05 |
| 6,690,185 | B1 * | 2/2004 | Khandros | .......... | G01R 1/07342 228/180.22 |
| 6,744,267 | B2 * | 6/2004 | Sauk | ................. | G01R 31/2886 324/754.03 |
| 6,747,447 | B2 * | 6/2004 | Markert | ............. | G01R 31/2886 324/750.19 |
| 7,180,321 | B2 * | 2/2007 | Behziz | ............... | G01R 31/2889 324/756.07 |
| 7,262,615 | B2 * | 8/2007 | Cheng | ................ | G01R 1/0483 324/756.05 |
| 7,301,326 | B1 * | 11/2007 | Green | ................ | G01R 31/2889 324/754.14 |
| 7,307,293 | B2 * | 12/2007 | Fjelstad | ............ | H01L 23/49805 174/110 R |
| 7,439,731 | B2 * | 10/2008 | Crafts | ................... | G01R 1/073 324/756.03 |
| 7,463,018 | B2 * | 12/2008 | Kushnick | ......... | G01R 31/31907 324/750.16 |
| 7,518,357 | B2 * | 4/2009 | Hopkins | ........... | G01R 31/2887 324/756.07 |
| 7,598,726 | B1 * | 10/2009 | Tabatabaei | ..... | G01R 31/318572 324/756.07 |
| 7,667,466 | B2 * | 2/2010 | Jackson | ............. | G01R 31/2844 248/128 |
| 7,710,106 | B2 * | 5/2010 | Crafts | ................ | G01R 1/07357 324/756.03 |
| 7,733,081 | B2 * | 6/2010 | Vayner | ............... | G01R 31/2889 324/756.01 |
| 8,102,184 | B2 * | 1/2012 | Sherry | ............... | G01R 1/06716 324/754.03 |
| 8,638,113 | B2 * | 1/2014 | Crafts | ................... | G01R 1/073 324/500 |
| 8,740,654 | B2 * | 6/2014 | Sedberry, Jr. | ........ | G01R 1/0408 439/716 |
| 8,884,639 | B2 * | 11/2014 | Anderson | ......... | G01R 31/2891 324/754.01 |
| 2006/0139017 | A1 * | 6/2006 | Peiffer | ............... | G01R 31/2889 323/282 |
| 2007/0152687 | A1 * | 7/2007 | Tsao | .................... | G01R 1/0735 324/756.03 |
| 2007/0202714 | A1 * | 8/2007 | Sherry | ................. | G01R 1/0735 439/68 |
| 2008/0106294 | A1 * | 5/2008 | Smith | ................ | G01R 31/2889 324/750.16 |
| 2008/0238461 | A1 * | 10/2008 | Skala | ................. | G01R 31/2808 324/756.01 |
| 2009/0302878 | A1 | 12/2009 | Sherry et al. | | |
| 2010/0079151 | A1 * | 4/2010 | Nordstrom | ....... | G01R 31/31901 324/555 |
| 2013/0045625 | A1 * | 2/2013 | Sedberry, Jr. | ........ | G01R 1/0408 439/540.1 |
| 2014/0062516 | A1 * | 3/2014 | Rashidzadeh | ...... | G01R 31/2889 324/750.19 |

FOREIGN PATENT DOCUMENTS

WO     WO 2004/093252 A2     10/2004
WO     WO 2010/104913 A1     9/2010

OTHER PUBLICATIONS

VPC, Copyright 2008, "Test & Measurement: Mass Interconnect Solutions Product Catalog." Virginia Panel Corporation, Apr. 15, 2008.*

Internaitonal Preliminary Report on Patentability prepared in respect of International Application No. PCT/CA2012/00214.

* cited by examiner

APPARATUS FOR THE AUTOMATED TESTING AND VALIDATION OF ELECTRONIC COMPONENTS

RELATED APPLICATIONS

This application claims the benefit under 35 USC §119(e) to U.S. Provisional Application No. 61/457,404, filed 21 Mar. 2011, entitled MEMS Based Device Interface Module.

SCOPE OF THE INVENTION

The present invention provides an apparatus for the automated testing and validation of electronic components. More particularly, the present invention relates to an apparatus which includes a MEMS based device interface module, and more particularly a high speed test interface panel or module for testing electronic components such as chips, resistors and/or diodes used in electronic circuitry and the like.

BACKGROUND OF THE INVENTION

Currently almost 100% of all electronic components are tested prior to assembly onto circuit boards. Such testing is highly desirable as in circuit board assembly processes up to 80,000 components may be used in each assembly line per minute. If a single component is defective, it is typically more cost effective to scrap the entire finished circuit board, rather than identify and repair any manufacturing defects.

As the speed of electronic circuitry manufacture has increased, various manufacturers have developed automatic test equipment to test and validate individual components. Conventional automatic test equipment typically includes a master controller which is electronically coupled to a signal simulator, sensing card or the like by way of a connector interface and mass interconnect system. The mass interconnect system is provided with a mounting table used to position and electronically couple a component device or unit under test to the simulator during testing. A robot handler physically positions the component device or unit under test to be tested within the automatic test equipment. Conventional automatic test equipment used to test individual components however, currently experience difficulties keeping pace with faster assembly speeds. In particular, conventional automatic test equipment (ATE) is limited to less than 12 GHz, and most typically operates at about 4 GHz.

Various manufactures have proposed automatic test systems which operate to test components at speeds as high as 77 GHz. However, major constraints exist with adopting higher processing speeds, as a result of limitations on current mass interconnect system mounting tables. At frequencies above a few gigahertz, testing integrated circuits becomes a challenging task. In particular, signal integrity degradation due to parasitic effects of interconnects and electromagnetic coupling undermines the test results at high speeds.

Conventional automatic test equipment incorporate a device interface unit to perform tests on integrated circuits. The device interface unit provides temporary electrical connections between the component or unit under test and the measurement instruments within the ATE. The device interface unit also provides space for unit under test-specific local circuits, such as buffer amplifiers and load circuits. The applicant has appreciated that it is highly desirable to reduce the physical distance between the unit under test and the testing circuitry of the ATE to lower transmission line effects and the electromagnetic coupling. One traditional approach is to locate the mounting table pin electronics of the automatic test equipment as close as possible to the unit under test pins. However, in practice general purpose pin electronics are designed to meet a variety of requirements to cover different test scenarios. As a result, general purpose pin electronics are commonly bulky and cannot be readily integrated and positioned adjacent to the unit under test pins. Furthermore, conventional mounting tables consume considerable amounts of power, and in some cases require liquid cooling systems to avoid overheating and maintain desired temperature. Heretofore, the problem of physical separation between unit under test and pin electronics has not been decisively solved. As a result, heretofore in the state of the art automated test equipment (ATE), this distance still may exceed several inches.

To reduce the length of transmission distance between the automated test equipment and unit under test, various techniques have been considered. In certain applications, test head circuitry may be removed from the mass interconnect assembly and located remotely in an attached mainframe chassis. In such constructions, comparators, programmable loads, drivers and switching circuits are typically left in the test head. The circuits are then integrated on a low power monolithic circuit to facilitate packaging and reduce cooling requirements. Although designing a pin electronics board in such a manner reduces the total length between the unit under test outputs and comparators inputs to approximately 2 to 3 inches for a conventionally packaged VLSI device, a 2 to 3 inch gap may still undermine signal integrity when frequencies exceed a few gigahertz.

Alternately, general purpose pin electronics may be replaced with device specific receivers. By restricting the pin electronics architecture to only a single device, the power and area overhead are reduced. Transceivers may then be fabricated and mounted on the unit under test interface board to serve as a local test interface. While such changes allow the characteristics of the inputs and outputs of the test system to be matched to the component or unit under test I/O pad and reduce both the effects of signal reflection as well as the distance between the device under test and pin electronics, such approach restricts the flexibility of the general purpose pin electronics architecture.

The applicant has appreciated that with the transient frequency of available complimentary-symmetry metal-oxide-semiconductor (CMOS) technologies exceeding 200 GHz, the architecture of the conventional testers needs to be greatly improved to maintain acceptable testing speeds. High-speed test signals experience a broad range of nonlinearities associated with the signal paths. It has been recognized that when the frequency of interaction between the unit under test and the automatic test equipment approaches the gigahertz range, the effects of transmission lines become a critical issue requiring matching impedances to minimize signal reflection and enhance the performance parameters of test channels. Moreover, AC resistance due to the skin effect and electromagnetic coupling caused by radiation become significant, degrading the signal integrity. These undesired effects eventually undermine the timing measurement accuracy and the test results.

SUMMARY OF THE INVENTION

To at least partially overcome at least some of the disadvantages associated with prior art devices, the present invention provides for an automatic test equipment (ATE) unit, which incorporates a mass interconnect system. The mass interconnect system is provided with a universal mounting table for use with receiver and test interface modules for electronically mounting and testing a variety of different types of electronic components or unit under test thereon. As will be described, the mass interconnect system includes a pin electronic array configured to minimize the physical separation between each individual unit under test and the pin electronics of the ATE.

In another embodiment, the present invention provides a mounting table test interface module based on MEMS technology, and which is adapted for electronic coupling with a receiver module of an ATE. In a preferred construction, high-speed micro test-channels are provided in the test interface module to establish signal connectivity between the components or unit under test and the tester at the die level, and more preferably which maintain the signal integrity up to 50 GHz without significant signal loss distortion.

In another embodiment, the present invention provides a MEMS based interface module for use in an ATE to perform high-speed testing of a plurality of electronic components and more preferably such components at a die level, as for example as part of a bulk testing procedure. The provided architecture of the interface module reduces the distance between the unit under test and pin electronics of the ATE less then 2000 and preferably less than about a few hundred micrometers. As a result, the transmission line effects may significantly attenuated, allowing the test channels to operate up to 50 GHz without considerable signal integrity degradation.

More preferably, a number of interchangeable MEMS based modules are incorporated into an automatic test equipment (ATE) mass interconnect test table for use in the high speed testing of a variety of different electronic components. Such electronic components or unit under test may include without restriction resistors, chips, diodes and the like. Preferably, the test table is operable to test devices rated at up to at least about 40 GHz, and preferably up to about 50 GHz, without requiring custom test head circuitry removal and/or reconfiguration.

Accordingly, in one aspect, the present invention resides in a mass interconnect system for use in automatic test equipment for concurrently testing of a plurality of electronic components of a unit under test, the interconnect system comprising: the receiver module including a forward mounting surface, a plurality of contact pins being mounted on and extending forwardly from said mounting surface, the receiver module for electronic coupling to a controller activatable to provide electronic signals simulating at least one selected test condition to selected one of said contact pins, a test interface module positionable adjacent to the forward mounting surface of the receiver module, the test interface module having a support surface for supporting the unit under test in a testing position thereon, the support surface including a plurality of spring contacts associated with a corresponding contact pin, the spring contacts comprising a conductive I/O pad and a resiliently deformable biasing member, the I/O pad being engagable with an associated one of said electronic components when the unit under test is moved to the testing position, and selectively movable between an operating position, wherein said I/O pad is moved rearwardly towards the mounting surface into electrical contact with said associated contact pin, and rest position where the I/O pad is moved forwardly a distance spaced therefrom, the resiliently deformable biasing member providing a threshold force to resiliently bias the I/O pad towards the rest position, and an actuator selectively operable to effect a contact pressure between the I/O pad and the associated electronic component greater than the threshold force to move the I/O pad to the operating position and effect electrical communication between the electronic component, I/O pad and associated contact pin.

In another aspect, the present invention resides in a mass interconnect system for use in automatic test equipment for effecting a selected test of an electronic component of a unit under test, the interconnect system comprising: a receiver module electronically coupled to a controller activatable to provide electric signals correlated to the selected test, the receiver module including a forward mounting surface, and a plurality of contact pins being mounted on and extending forwardly from said mounting surface, a test interface module positioned adjacent to the forward mounting surface of the receiver module, the test interface module having a support surface for supporting the unit under test in a testing position thereon, the support surface including a plurality of spring contacts associated with a corresponding contact pin, the spring contacts comprising a conductive pad and a resiliently deformable pad support, the conductive pad being engagable with said electronic component when the device under test is in the testing position, the conductive pad being movable from a rest position, where the conductive pad is moved forwardly to a position spaced from the associated contact pin, and an operating position, where said conductive pad is moved towards the mounting surface and into electrical contact with said associated contact pin, the resiliently deformable pad support resiliently biasing the contact pad towards the rest position, and an actuator assembly selectively operable to effect contact between the conductive pad and the electronic component to move the contact pad to the operating position and effect electrical communication between the electronic component, I/O contact pad and said associated contact pin. In yet a further aspect, the present invention resides in a test interface module for use in a mass interconnect system for electronic component testing, the mass interconnect system including a receiver module electronically connectable to and activatable to provide electric signals correlated to a selected component test, the receiver module including a forward mounting surface, and a plurality of contact pins extending forwardly relative to said mounting surface, the test interface module positionable adjacent to the forward mounting surface of the receiver module, the test interface module having a support surface for supporting a unit under test comprising a plurality of electronic components to be tested in a testing position thereon, the support surface including a plurality of spring contacts associated with a corresponding contact pin, the spring contacts comprising a conductive pad and a resiliently deformable support, at least one of said conductive pad being engagable with an associated one of said electronic components when the device under test is in the testing position, the conductive pad being movable between a rest position, where the conductive pad is moved to a position spaced from the associated contact pin, and an operating position, where said conductive pad is moved towards the mounting surface and into electrical contact with said associated contact pin, and an operating position, wherein said conduct pad is moved into electrical communication with an associated contact pin, the deformable support resiliently biasing the contact pad towards the rest position, and whereby the conductive pad is movable from the rest position to the operating position on the application of a predetermined threshold force to the unit under test, to effect electrical communication between the electronic component, the contact pad and the associated contact pin.

BRIEF DESCRIPTION OF THE DRAWINGS

Reference may now be had to the following detailed description, taken together with the accompanying drawings, in which.

DETAILED DESCRIPTION OF THE PREFERRED EMBODIMENTS

Figure 1:
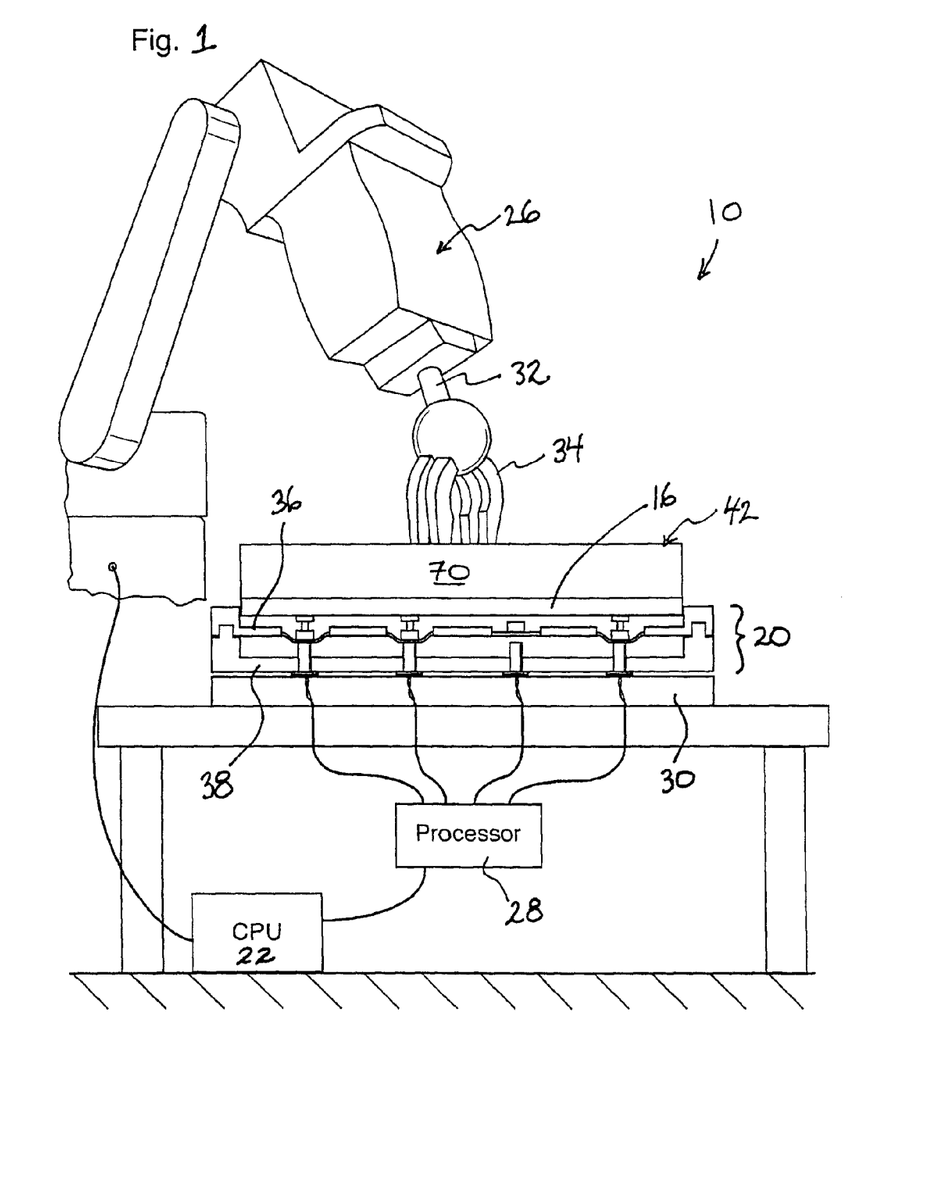
FIG. 1 illustrates schematically an automatic test equipment which incorporates a mass interconnect system operable to provide temporary testing signal paths between the automatic test equipment and a number of units under test.
Figure 2:
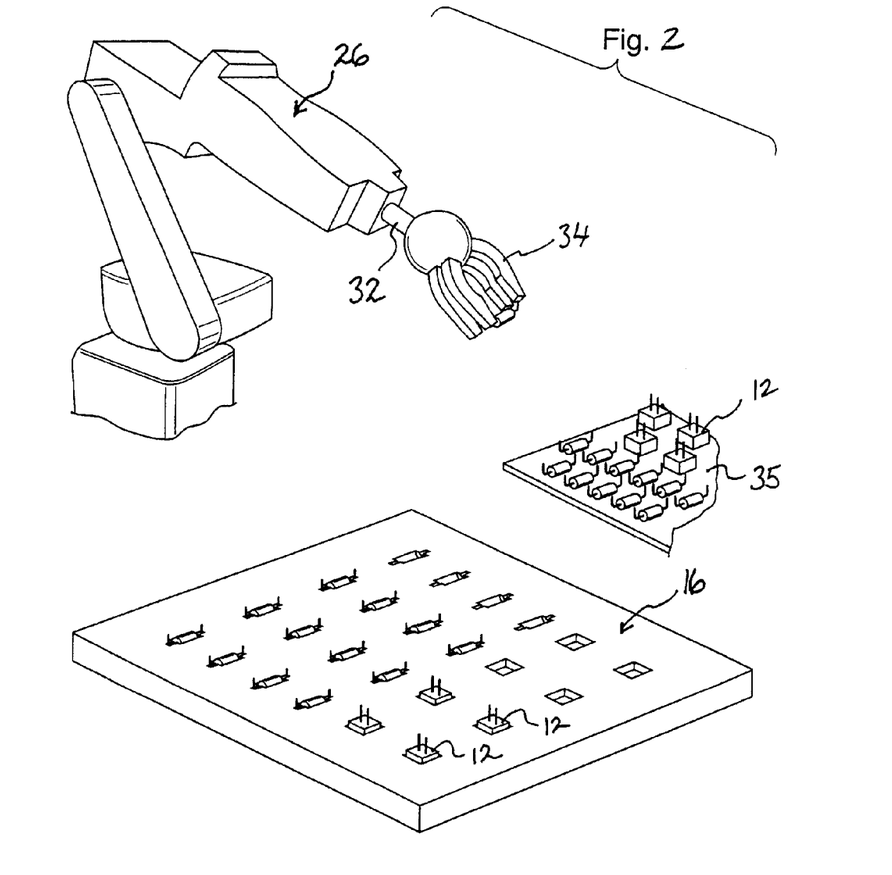
FIG. 2 shows schematically a robot assembly used in the positioning of electrical components in a testing die for use in an automatic test equipment of FIG. 1.

Reference is made to FIG. 1 which shows an automatic test equipment 10 unit for use in the automated testing and validation of electronic components 12 (FIG. 2) and preferably the concurrent testing of multiple components 12 positioned with a test die 16 prior to their assembly as part of a circuit board and/or the like. As will be described, the automatic test equipment 10 is provided with a mass interconnect system 20 which is configured to achieve the simultaneous high speed testing of a variety of different types of electronic components 12, including by way of non-limiting example, switches, chips, resistors, diodes, and the like without requiring significant device-specific customization and/or reconfiguration for each different die or unit under test 16 to be tested.

As shown best in FIG. 1, in addition to the mass interconnect system 20, the automatic test equipment 10 includes a main processor 22, a robotic handler assembly 26, a test protocol controller 28, and an interconnect module interface 30.

The main processor 22 provides overall control to the mass interconnect system 20, the robotic handler assembly 26 and the test protocol controller 28 in initial placement of multiple components 12 into the test die 16; as well as the positioning, testing and removal of the testing die 16 into the mass interconnect system 20 as a unit under test, and its subsequent removal therefrom following testing.

In a simplified construction, the robotic handler assembly 26 includes a three axis movable robot arm 32 which has a selectively actuable gripping fixture 34, and which is operable to move the components 12 individually from a supply station 35, into the test die 16. Following placement of the components 12 in the die 16, the robot arm 32 moves the die 16 into the mass interconnect system 20 for component testing; and thereafter following testing and validation to a discharge station (not shown). Optionally, the handler assembly 26 may be provided with multiple robot arms 32 which are used to simultaneously pre-position multiple components 12 in a grouped prearranged array within the die 16 as a desired unit under test.

Figure 4:
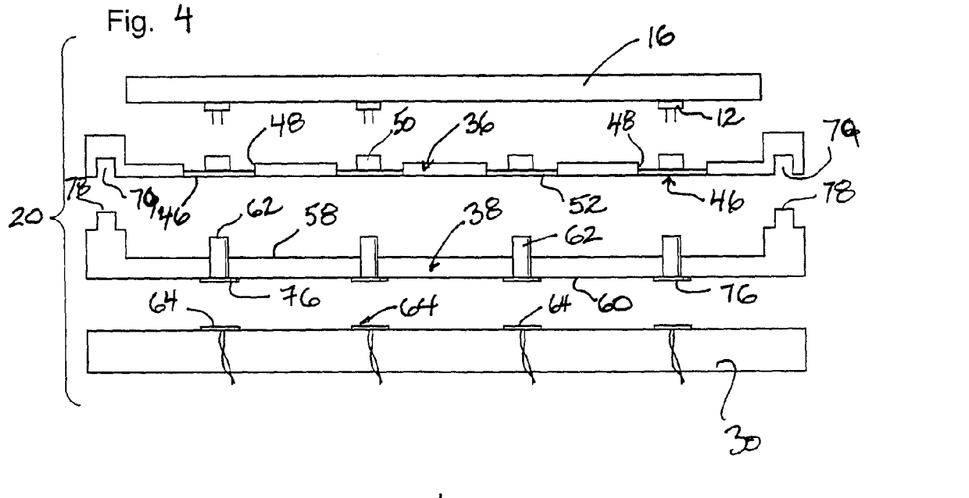
FIGS. 4 to 6 show schematically an enlarged schematic view of the mass interconnect system incorporating the MEMS based test interfaced module and receiver module used in the ATE of FIG. 1.
Figure 5:
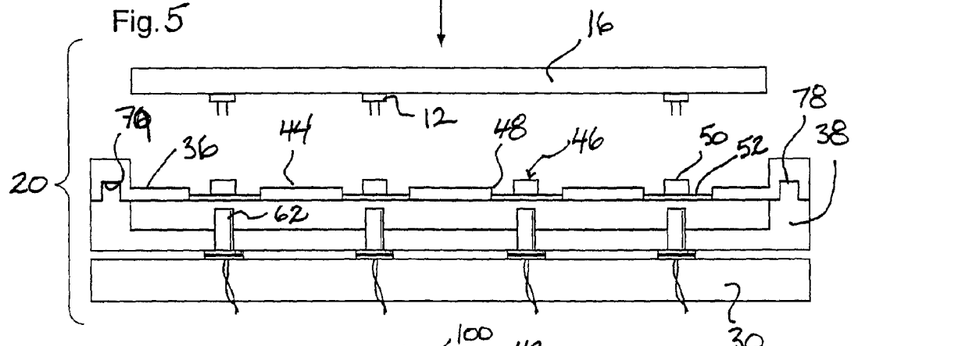
Figure 6:
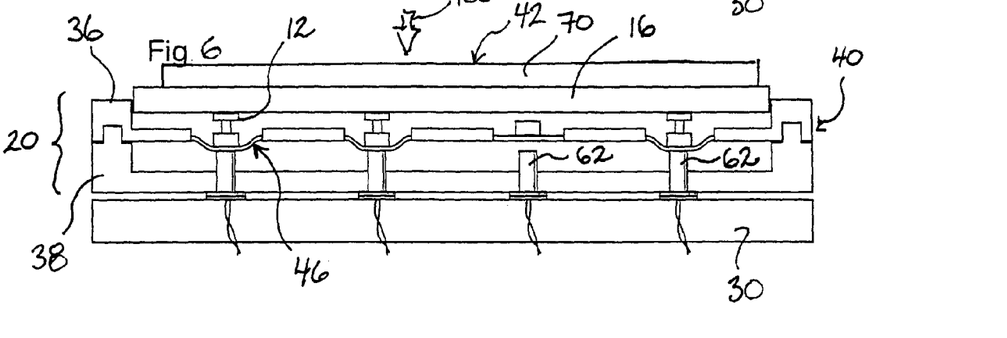

The mass interconnect system 20 is shown best in FIGS. 4 to 6 as including a modular test interface board 36 and a modular interface receiver board 38 which collectively function as a testing mounting table 40 for supporting the die/unit under test 16 during testing and validation. As will be described, an actuator assembly 42 is provided for use in positioning the test interface board 36 relative to the receiver board 38 during component testing.

Figure 3:
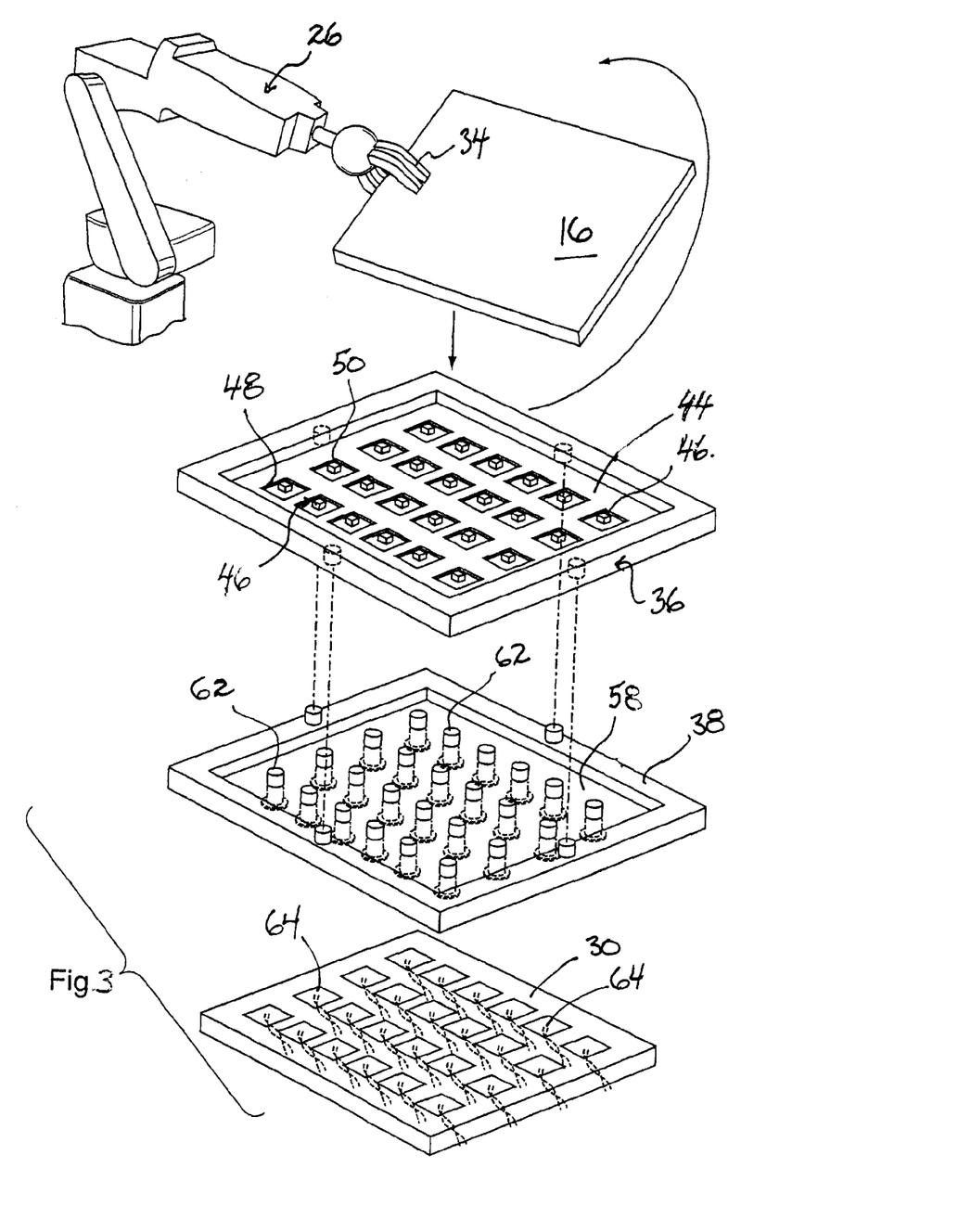
FIG. 3 shows schematically the positioning of the testing die of FIG. 2 in the mass interconnect system testing table of the automated test equipment of FIG. 1.

In the construction of FIG. 3, a preferred test interface board 36 used in the testing mounting table 40 (FIG. 5) is provided as a generally rectangular panel having a planar top central surface 44. An array of between about 25 to about 500 spring contacts 46 are positioned within a corresponding aperture 48 extending through the panel 36. FIG. 3 shows the upper surface 44 of the removable test interface board 38 as including an array of contact spring connectors 46, each of which is about 50 to 1000 μm and preferably about 50 to 150 μm long. The spring connectors 46 provide temporary electrical connection between the components 12 in the die 16 or unit under test and the automatic test equipment 10. As will be described, the top of the spring contacts 46 provide temporary electrical connection with the electrical leads of the electrical components 12 secured die 16 or unit under test, while the bottom of the contact spring 46 provides the connectivity with the ATE pin electronics through the interface receiver board 38 as shown in FIG. 6. Although not essential, most preferably, the test interface board 36 is provided as a modular interchangeable board. Accordingly, different interface boards 36 may be used in the automated test equipment 10 depending on the particular electrical component and/or unit under test to be validated.

Figure 7:
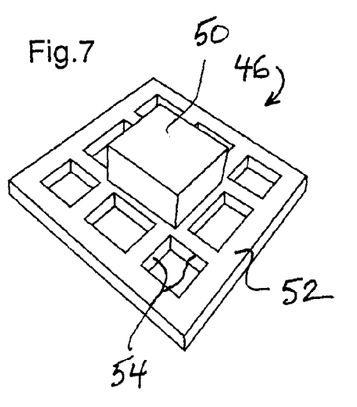
FIG. 7 illustrates schematically a MEMS contact spring used in the test interface module of FIG. 2, in electronically coupling a unit under test to a receiver module, in a relaxed state.
Figure 8:
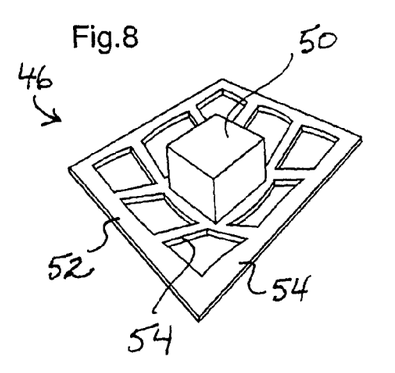
FIG. 8 illustrates schematically the MEMS contact spring of FIG. 7 under a mass load pressure during component testing.
Figure 10:
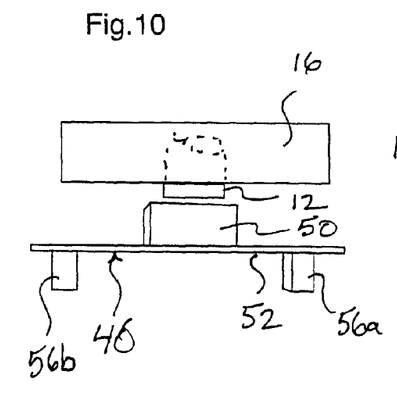
FIG. 10 illustrates schematically a cross sectional view of the contact spring of FIG. 7 and an electronic component of a unit under test prior to applying a mass load pressure.

FIGS. 7 and 8 show best each spring contact 46 as including a centrally disposed conductive metal contact pad 50 which is supported by an elastically deformable sling assembly 52. The sling assembly 52 is formed as a generally planar square lattice 54 which is secured along peripheral edge portions to the adjacent portions of the test interface board 36 by edge supports 56a,56b (FIG. 10). In a preferred construction, the lattice 54 is formed from a suitable elastically deformable material, and most preferably silicone, selected to resiliently return to an initial unbiased state.

As will be described, the test interface board 36 is used to support the die 16 or unit under test with the pin contacts of selected electronic components 12 in electrical contact with an associated contact pad 50, so as to permit the transmission of electrical test signals therebetween. Although not essential, most preferably the spring contacts 46 are provided as part of a preselected geometric array which is configured to allow the positioning of a number of differing test dies 16 thereon, for component testing and validation of a number of different component types.

FIGS. 3 and 4 show the interface receiver board 38 used in the mass interconnect system 20. The central portion of the interface receiver board 38 is preferably provided with generally planar, upper forward and lower rear surfaces 58, 60. An array of electrical contact pins 62 is provided in the central portion 58, and which project upwardly from the forward surface 58. The upper surface 58 of the fixed receiving board 38 most preferably includes a bed of micro contact pins 62 which are each electronically coupled to an associated solder pad 76. The contact pins 62 are positioned and configured to establish electrical connections with an underside of the removable interface receiver board 38, as well as a selected die 16 under testing. The micro contact pins 62 are preferably formed from gold and are provided as substitutes for conventional pogo pins commonly used in automatic test equipment. In particular, the contact pins 62 are arranged in a preselected geometric array so that at least one contact pin 62 corresponds to that of a contact pad 50, so as to align therewith when the test interface board 36 is moved into juxtaposed alignment with the receiver board 38 in assembly of the testing mounting table 40.

Although not essential, the interface receiver board 38 may also be formed having a modular construction whereby the contact pins 62 are each electronically connected with an associated contact pad 50 formed on the lower rear surface 60. The lower surface 60 of the receiver board 38 may further include an array of the solder pads 76 which are configured and positioned to directly connect to the automated test equipment pin electronics as shown in FIG. 6. Each solder pad 76 in turn is provided for electronic coupling with corresponding permanent pin contact 64 provided within the interconnect module interface 30.

The interconnect module interface 30 is provided in electronic communication with the test protocol controller 28 to receive and send testing signals therefrom. The module interface 30 is further provided with a test table housing or support surface for receiving the modular test interface board 36, receiver board 38 and die 16 thereon during testing operations.

With the interface receiver board 38 positioned on the support surface or housing of the interconnect module interface 30, the contact pads 50 may be provided into electronic connection with an associated permanent pin contact 64, to thereby transmit electronic test signals between the test protocol controller 28, the receiver board 38 and the test interface board 36 in testing operation. The module interface 30 preferably also includes a pressing element 70. The pressing element 70 being selectively operable to apply a preselected downward contact pressure on the die 16 when secured in a testing position in generally juxtaposed alignment over the test interface board 36.

FIGS. 4 to 6 show the test interface board 36 and receiver board 38 as respectively including complimentary alignment keys 78,79. The alignment keys 78,79 are configured for complimentary engagement to facilitate the assembly of the testing mounting table 40 within the test table housing, and with contact pads 50, contact pins 62 and permanent pin contacts 64 directly aligned. As shown best in FIG. 4, in initial assembly, the test interface board 36 is positioned immediately above the forward surface 58 of the interface receiver board 38. When first positioned, the contact pad 50 of each spring contact 46 assumes an unbiased position, spaced a marginal distance above the associated contact pin 62, and preferably spaced a distance selected at preferably about 5 and 20 microns.

Most preferably, a number of electrical components 12 are pre-positioned within the test die 16 or unit under test. The die 16 is moved by way of the robotic handler assembly 26 to a juxtaposed position on top of the test interface board 36. The die 16 is most preferably tested in the automatic test equipment 10 so that multiple individual electronic components 12 are tested concurrently. The connectivity is established by actuating the pressing element 70 to apply a low pressure mass load on top of the die 16.

It is to be appreciated that the final selection of the test interface board 36 to be used in the testing mounting table 40 will depend on the specific electrical component 12 to be tested and/or the die 16 under test. Following alignment and placement of the test interface board 36 over the interface receiver board 38, the die 16 is positioned in juxtaposed alignment with the top surface of the test interface board 36, so that the electrical contact leads of each individual component 12 is brought into electronic communication with the contact pad 50 of an associated spring contact 46.

With the die 16 or unit under test positioned in juxtaposed alignment with the top surface 44, the processor 22 is used to activate the pressing element 70 to apply a downward pressure on the die 16 or unit under test. The application of a downward pressure (arrow 100 in FIG. 6) which exceeds a predetermined minimum pressure results in a contact force between the electrical leads of the components 12 and contact pad 50 which elastically deforms the lattice 54 and effects the downward displacement of the contact pads 50 into electronic communication with the associated contact pin 62. While the pressing element 70 is so deployed, the test protocol controller 28 is thereafter activated, transmitting and receiving desired test signals to and from each electronic component 12 via the permanent pin contact 64, contact pin 62 and contact pad 50 of the spring contact 46. The test protocol controller 28 is configured to activate one or more of a series of preselected testing protocols on the electronic components 12, while the die 16 or unit under test is positioned on the testing mounting table 40 by the handler assembly 26. The test protocol controller 28 may include without limitation, a digital power supply (DPS); a parametric measurement unit (PMU); and arbitrary wave form generator (AWG); and/or digital I/O.

The MEMS based test interface board 36 is most preferably configured to accommodate test interface circuits usually required to perform functional tests on high speed analog and RF circuits. The test interface board 36 as compared to conventional device interface boards, provides necessary means for fault detection at the die level. This enables manufacturers to detect electronic component faults at the die level, before packing and/or assembly on circuit boards. Therefore, the cost of packaging, which is frequently a major portion of the overall cost of current fabrication, may be virtually eliminated.

a) Spring Contact

A preferred MEMS based construction of spring contacts 46 used in the ATE 10 is shown best in FIGS. 7 and 8. In a most preferred construction, the spring contacts 46 have a square geometry with a length and width dimension of about 100× 100 μm. Each spring contact 46 includes a rectangular central conductive metal pad 50, and which is supported in a central area of the elastically deformable sling assembly 52. Preferably, the contact pad 50 has width and length dimensions of about 40×40 μm, and a height thickness of about 5 to 30 μm, and preferably 10 μm. The contact pad 50 is supported about its edge periphery only by the sling lattice 54, and which consists of eight integrally formed silicone beams of generally equal length. The sling lattice 54 is in turn suspended within the test interface board apertures along opposing edges by edge sling supports 56a,56b (FIG. 10). The sling assembly 52 is configured so that when unbiased, the contact pad 50 is maintained in a raised position spaced above associated contact pin 62, with the silicone lattice 54 maintaining symmetrical pressure around the contact pad 50. The spring contact 46 is most preferably formed so as to satisfy the following criteria: (a) a flat top surface of the contact pad 50 provides larger contact area to minimize the contact resistance with the electronic component 12; (b) low contact force; (c) small area to be matched with the die contact pins 52; (d) negligible shear; and (e) reliable elastic performance.

Figure 9:
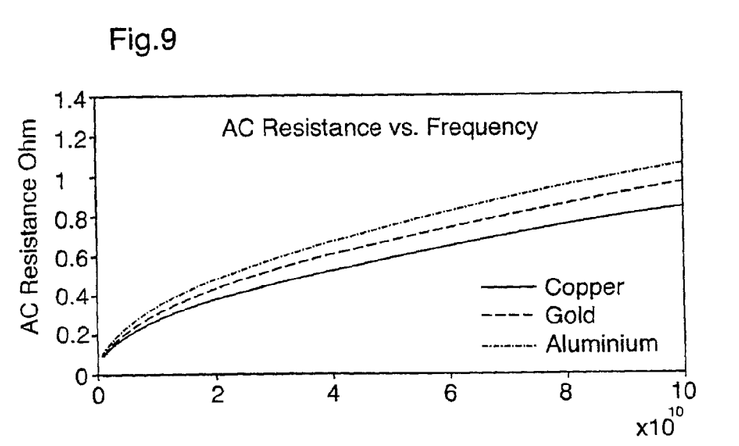
FIG. 9 illustrates graphically the relationship between AC resistance for selected contact spring metals versus frequency.

The yield strength of the sling assembly 52 is defined by the stress where a material begins to deform plastically. Plasticity is the deformation of a material undergoing nonreversible permanent change in response to applied load. Because of its high stress yield, silicone is selected as a preferred supporting material. Skin effect is the tendency of AC currents to flow near the surface of the conductor. The distance below the surface where the current density becomes 1/e of its value at the surface is called the skin depth, and it is given by $$\delta = \sqrt{\frac{2\rho}{\omega}\mu}$$

where $\rho$ is the resistivity of conductor, $\omega=2\pi f$ is the angular frequency in radians/second, and
$\mu$=absolute magnetic permeability of conductor, $\mu=\mu_o\mu_r$ where $$\mu_o = 4\pi \times \frac{10^{-7}N}{A^2}$$

is the permeability of free space and $\mu_r$ is the relative permeability of the conductor. At high frequency the effective resistance increases due to skin effect. For long, cylindrical conductors the AC resistance$^R$ is given by $$R = \frac{\rho}{\delta}\left(\frac{L}{\pi(D-\delta)}\right) \approx \frac{\rho}{\delta}\left(\frac{L}{\pi D}\right) \quad (1)$$

where L and D are the length and the diameter of the conductor respectively. The approximation above is valid if $D\gg\delta$. The AC resistance versus frequency for copper, gold, and aluminum was calculated up to 100 GHz as shown in FIG. 9. Copper was selected as the preferred material for the contact pad 50 among different metals for its high tensile strength, good conductivity, and low skin effect.

Figure 11:
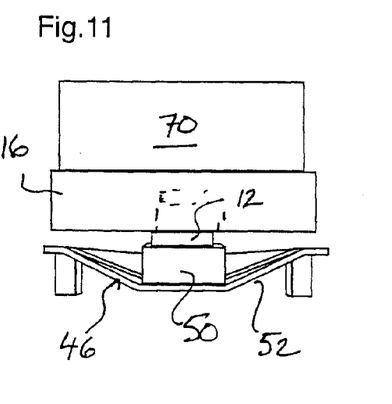
FIG. 11 illustrates schematically a cross sectional view of the contact spring and electronic components of FIG. 10 under mass load pressure, and showing temporary electronic connection during operation of the automatic test equipment of FIG. 1.

A side perspective view of a contact spring 46 and electronic component 12 under test in the steady and deformed state are shown in FIGS. 10 and 11. The pressure load mass 70 positioned on top of the die 16 effects a pressing force against the spring contacts 46 of the removable interface receiver board 38 to maintain the connection during the test phase. The pressure load mass 70 is preferably minimized to keep the deformation of the contact springs 46 within the limits of material elasticity of the sling assembly 52 and away from the plasticity region.

Simulation Results

Electromagnetic performance parameters and spice models for MEMS contact springs were extracted using the industry-standard tools HFSS™ and Q3DExtraxtor™.

Figure 12:
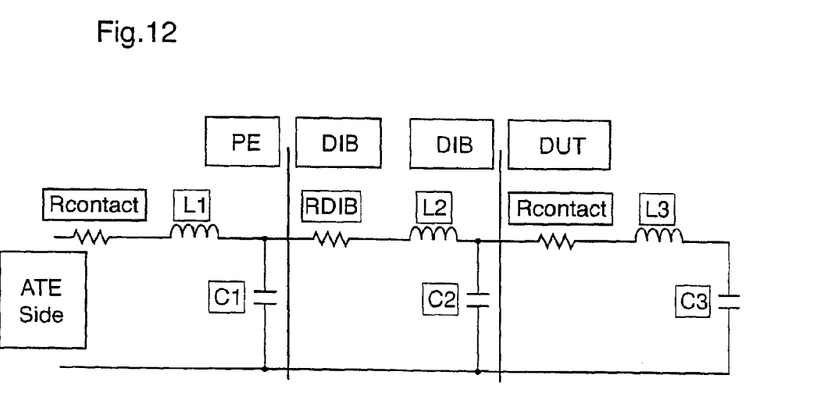
FIG. 12 illustrates schematically the signal path from the automatic test equipment pin electronics to the electronic component under test contact paths.

The generalized lumped-element model for the transmission line from the ATE pin electronics to the unit under test contact pads is shown in FIG. 12, wherein $R_{DIB}$, C2, and L2 are the resistance, capacitance and inductance of the device interface board contact spring respectively. $R_{contact}$, C1, C3, L1 and L3 are the lumped parameters at PE/device interface board and the device interface board/die under test interfaces.

Simulation results indicate the performance difference between were compared for a typical strip-line 8 cm long with the cross section of 0.25×0.04 mm, a coax-cable of 10 cm long with the cross section of 0.13×0.14 mm and a proposed MEMS device test interface board section providing electric connectivity between the automatic test equipment pin electronics and a component device under test contact pad using the spice extracted models. The input signal for the analysis carried out in this section was a sinusoidal waveform of one volt peak-to-peak.

Figure 13:
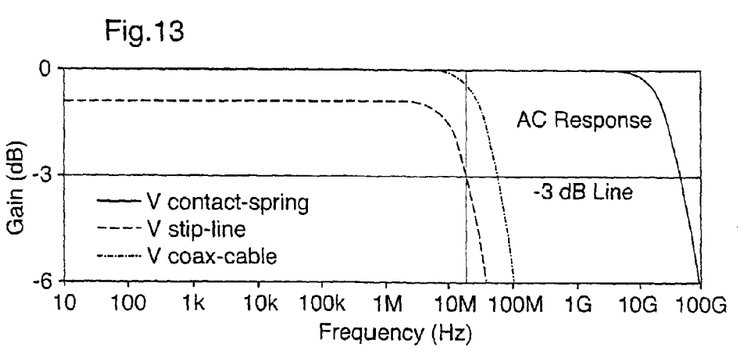
FIG. 13 illustrates graphically the AC response for the contact spring of FIG. 7, a strip-line and a coax cable.

The AC responses for the three mentioned models are shown in FIG. 13. The −3 dB bandwidth for the strip-line and the coax cable lie at 20 MHz and 70 MHz respectively, indicating that the input signals for both models are heavily attenuated beyond 100 MHz. This will limit the dynamic range of the test signals and can reduce the signal integrity and the signal to noise ratio considerably. The AC response of the MEMS interface shows drastic improvement over the conventional solutions. The −3 dB bandwidth lies in the vicinity of 50 GHz which is higher than the bandwidth of currently available test channel by orders of magnitudes.

Figure 14:
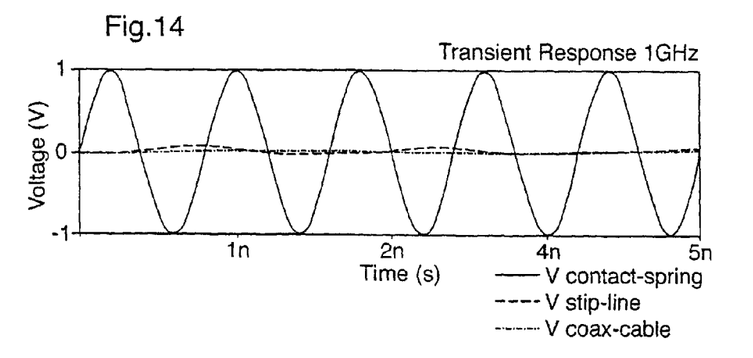
FIG. 14 illustrates graphically the volt peak-to-peak output versus input voltage at 1 GHz for each of the contact spring of FIG. 7, a strip-line and a coax cable.
Figure 15:
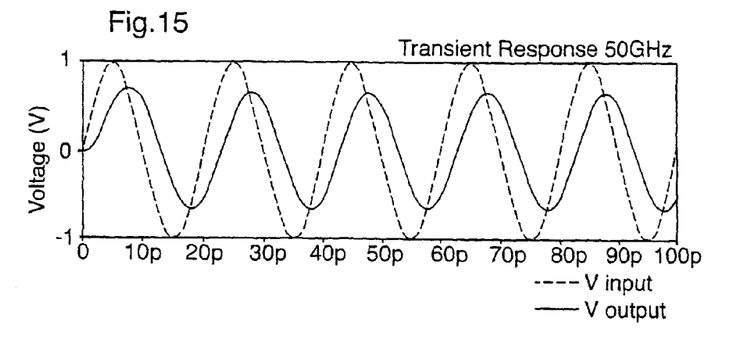
FIG. 15 illustrates the peak-to-peak output voltage at 50 GHz for the contact spring of FIG. 7.

FIG. 14 shows the transient response at 1 GHz for the three extracted models. The signal integrity is maintained for the contact spring while it is extremely degraded for both the strip-line and the coax cable; only at low frequencies less than 1 GHz the signal can be transmitted. FIG. 15 shows the response for the contact spring at 50 GHz. The signal integrity can be preserved up to 50 GHz with little loss or distortion.

Table I and Table II present the extracted lumped parameters at 1.00 GHz and 50 GHz. The contact spring 46 of the present invention shows significantly lower values of parasitic capacitance and inductance as compared to the strip-line and the coax cable models. The proposed test interface board module also provides lower path resistance between the electrical component under test and the automatic test equipment resources. The lower resistance, capacitance and inductance values for the contact spring 46 allow the MEMS structure to operate at higher frequencies without the loss of signal integrity.

TABLE I

EXTRACTED PARAMETERS USING Q3DEXTRACTOR AT 1.0 GHz.

| | $R_{AC}$ m THE Ω | Inductance | Capacitance |
|---|---|---|---|
| Contact Spring 100 × 100 μm-540 μm long | 21.7 mΩ | 0.1 nH | 10.7 fF |
| Strip-Line 0.25 × 0.04 mm-8 cm long | 1.1 Ω | 100 nH | 1.87 pF |
| Coax Cable 0.13 × 0.10 mm-15 cm long | 2.7 Ω | 182 nH | 2.53 pF |

TABLE II

THE EXTRACTED PARAMETERS USING
Q3DEXTRACTOR AT 50 GHz.

|  | $R_{AC}$ mΩ | Inductance | Capacitance |
|---|---|---|---|
| Contact Spring 100 × 100 μm-540 μm long | 153 mΩ | 0.1 nH | 10.7 fF |
| Strip-Line 0.25 × 0.04 mm-8 cm long | 7.7 Ω | 110 nH | 2.9 pF |
| Coax Cable 0.13 × 0.10 mm-15 cm long | 10.7 Ω | 223 nH | 3.13 pF |

The foregoing construction establishes a viable test interface board module which is suitable for use in automatic test equipment 10 for the high speed testing of electronic components. The proposed MEMS based structure can reduce the physical separation between the die under test and the ATE resources by orders of magnitude due to its micro-scale sizes. The MEMS device test interface board 36 of the present invention avoids problem of undesired transmission line effects that limits the bandwidth of ATE test channels. The parasitic capacitances and inductances due to long wire traces in conventional test channels are reduced considerably allowing the MEMS test channels to operate at much higher frequencies. The MEMS device interface board test channels can operate up to 50 GHz while maintaining a high level of signal integrity. The proposed interface module can also provide a place for testing interface circuits to enhance the electrical performance of the tester during critical tests. Furthermore, the MEMS device test interface board 36 can be used to establish necessary test channels between a die under test and the ATE measurement instruments. Conducting test at the die 16 level reduces the cost of fabrication by detecting and removing faulty devices from the production line before the added expense of packaging.

It is to be appreciated that the present invention may be provided as a stand alone test interface module. More preferably however a number of the high speed test interface modules are incorporated into a test table 40 for the precision testing of electronic components including without restriction advanced micro-processors, PC chipsets and graphics, disk drives, video game devices, system on a chip (SiP), memory, baseband digital, network and broadband devices.

While the preferred embodiment describes and illustrates the spring contact 46 as including silicone lattice as resiliently deformable pad support, the invention is not so limited. It is to be appreciated that different pad support constructions and/or materials may also be used and will now become readily apparent.

Although the detailed description describes and illustrates various preferred embodiments, the invention is not expressly limited to the preferred embodiments which are disclosed. Many variations and modifications will now appear to a person skilled in the art. For a definition of the invention, reference may be had to the appended claims.

We claim:

1. A mass interconnect system for use in automatic test equipment for concurrently testing of a plurality of electronic components of a unit under test, the interconnect system comprising:
   a receiver module including a forward mounting surface, a plurality of contact pins being mounted on and extending forwardly from said mounting surface, the receiver module for electronic coupling to a controller activatable to provide electronic signals simulating at least one selected test condition to selected one of said contact pins,
   a test interface module positionable adjacent to the forward mounting surface of the receiver module, the test interface module having a support surface for supporting the unit under test in a testing position thereon, the support surface including a plurality of spring contacts associated with a corresponding contact pin, the spring contacts comprising a conductive I/O pad and a resiliently deformable biasing member,
   the I/O pad being engagable with an associated one of said electronic components when the unit under test is moved to the testing position, and selectively movable between an operating position, wherein said I/O pad is moved rearwardly towards the mounting surface into electrical contact with said associated contact pin, and rest position where the I/O pad is moved forwardly a distance spaced therefrom,
   the resiliently deformable biasing member providing a threshold force to resiliently bias the I/O pad towards the rest position, and
   an actuator selectively operable to effect a contact pressure between the I/O pad and the associated electronic component greater than the threshold force to move the I/O pad to the operating position and effect electrical communication between the electronic component, I/O pad and associated contact pin.

2. The mass interconnect system of claim 1, wherein the resiliently deformable biasing member includes a generally planar polygonally-shaped deformable support lattice, the I/O pad being mounted to said support lattice.

3. The mass interconnect system of claim 1, wherein the biasing member includes a generally square deformable support lattice, the lattice including a plurality of silicone cross-members, in the rest position, the support lattice being spaced from said mounting surface by one or more peripheral shoulder members, and wherein the I/O pad being mounted towards a central portion of said support lattice.

4. The mass interconnect system of claim 3, wherein the support lattice has length and width dimensions selected at between about 25 and 200 microns.

5. The mass interconnect system of claim 1, wherein the I/O pad is provided with a generally square cross-sectional shape and has a width and length dimensions selected at between about 20 and 100 microns.

6. The mass interconnect system of claim 1, wherein the I/O pad is a conductive metal pad having a height in a forward direction selected at between about 5 and 50 microns.

7. The mass interconnect system of claim 1, wherein said contact pins are mounted to said mounting surface in a generally equispaced polygonal array.

8. The mass interconnect system as claimed in claim 1, wherein the receiver module further includes a seating surface rearward from said mounting surface, a plurality of electrically conductive contact pads being disposed on said seating surface.

9. The mass interconnect system as claimed in claim 8, wherein the automatic test equipment further includes a receiver housing, the receiver module being releasably coupled to the receiver housing, the receiver housing including a receiver module interface comprising a pin electronics array electrically connectable with at least some of said contact pads when said receiver module is coupled thereto.

10. The mass interconnect system as claimed in claim 1, wherein the test interface module is detachably connectable to said receiver module, at least one of the test interface module and the receiver module including guide members for aligning the test interface module spring contacts with the corresponding contact pin when connecting the test interface module to the receiver module.

11. The mass interconnect system as claimed in claim 1, including a plurality of said test interface modules, each of said test interface modules having a modular interchangeable construction configured for selective electronic coupling and decoupling with said receiver module.

12. A mass interconnect system for use in automatic test equipment for effecting a selected test of an electronic component of a unit under test, the interconnect system comprising:
a receiver module electronically coupled to a controller activatable to provide electric signals correlated to the selected test, the receiver module including a forward mounting surface, and a plurality of contact pins being mounted on and extending forwardly from said mounting surface,
a test interface module positioned adjacent to the forward mounting surface of the receiver module, the test interface module having a support surface for supporting the unit under test in a testing position thereon, the support surface including a plurality of spring contacts associated with a corresponding contact pin, the spring contacts comprising a conductive pad and a resiliently deformable pad support,
the conductive pad being engagable with said electronic component when the device under test is in the testing position, the conductive pad being movable from a rest position, where the conductive pad is moved forwardly to a position spaced from the associated contact pin, and an operating position, where said conductive pad is moved towards the mounting surface and into electrical contact with said associated contact pin,
the resiliently deformable pad support resiliently biasing the conductive pad towards the rest position, and conductive pad to the operating position and effect electrical communication between the electronic component, conductive pad and said associated contact pin.

13. The mass interconnect system as claimed in claim 12, wherein the pad support includes a generally planar square lattice, the lattice secured in a position spaced from said mounting surface by at least one peripheral shoulder member, and wherein the conductive pad is secured towards a central portion of said lattice.

14. The mass interconnect system as claimed in claim 13, wherein the lattice comprises a plurality of silicone crossmembers.

15. The mass interconnect system as claimed in claim 14, wherein the lattice has length and width dimensions selected at between about 25 and 200 microns. and the conductive pad comprises a metal contact pad having width and length dimension selected at between about 20 and 100 microns.

16. A test interface module for use in a mass interconnect system for electronic component testing, the mass interconnect system including a receiver module electronically connectable to and activatable to provide electric signals correlated to a selected component test, the receiver module including a forward mounting surface, and a plurality of contact pins extending forwardly relative to said mounting surface,
the test interface module positionable adjacent to the forward mounting surface of the receiver module, the test interface module having a support surface for supporting a unit under test comprising a plurality of electronic components to be tested in a testing position thereon, the support surface including a plurality of spring contacts associated with a corresponding contact pin, the spring contacts comprising a conductive pad and a resiliently deformable support,
at least one of said conductive pad being engagable with an associated one of said electronic components when the unit under test is in the testing position, the conductive pad being movable between a rest position, where the conductive pad is moved to a position spaced from the associated contact pin, and an operating position, where said conductive pad is moved towards the mounting surface and into electrical contact with said associated contact pin,
the deformable support resiliently biasing the conductive pad towards the rest position, and whereby the conductive pad is movable from the rest position to the operating position on the application of a predetermined threshold force to the unit under test, to effect electrical communication between the electronic component, the conductive pad and the associated contact pin.

17. The test interface module as claimed in claim 16, wherein the deformable support includes a generally planar deformable lattice, the conductive pad being secured to a generally central portion of said lattice.

18. The test interface module as claimed in claim 16, wherein the lattice includes a plurality of silicone support members.

19. The test interface module as claimed in claim 17, wherein the lattice has length and width dimensions selected at between about 25 and 250 microns and the conductive pad having a width and length dimension selected at between about 20 and 150 microns.

20. The test interface module system as claimed in claim 16, wherein the test interface module has a modular interchangeable construction configured for selective electronic coupling and decoupling with said receiver module.

* * * * *